United States Patent [19]

Reid et al.

[11] 4,195,259

[45] Mar. 25, 1980

[54] MULTIPROBE TEST SYSTEM AND METHOD OF USING SAME

[75] Inventors: Lee R. Reid, Plano; Charles R. Ratliff, Richardson, both of Tex.

[73] Assignee: Texas Instruments Incorporated, Dallas, Tex.

[21] Appl. No.: 893,118

[22] Filed: Apr. 4, 1978

[51] Int. Cl.² .................. G01R 1/06; G01R 31/02
[52] U.S. Cl. .................. 324/158 P; 324/72.5; 324/158 F
[58] Field of Search .............. 324/158 P, 158 F, 72.5, 324/149; 339/108 TP; 310/330

[56] References Cited

U.S. PATENT DOCUMENTS

| | | | |
|---|---|---|---|
| 3,093,710 | 6/1963 | Eyck | 310/330 |
| 3,810,017 | 5/1974 | Wiesler et al. | 324/158 P |
| 3,849,728 | 11/1974 | Evans | 324/158 P |

OTHER PUBLICATIONS

Byrnes et al., "Self-Measurement of Probe Deflection"; IBM Tech. Disc. Bull.; Jun. 1977; pp. 166-167.

Primary Examiner—Rudolph V. Rolinec
Assistant Examiner—Ernest F. Karlsen
Attorney, Agent, or Firm—William E. Hiller; Melvin Sharp; Richard L. Donaldson

[57] ABSTRACT

A multiprobe test system is disclosed for testing microcircuits which includes a printed circuit board having a plurality of data-detector probes attached for z-axis control and edge detection. The data-detector probes include a support body, and an arm supported by the body and attached thereto in an angular fashion. A probe tip in the form of a needle extends from and is attached to the arm. The probe tip includes a downwardly positioned point for contact with the surface having integrated circuits defined thereon. A force sensitive material is attached to but electrically isolated from the arm and has conductor leads extending therefrom. The force sensitive material comprises a piezoelectric material, for example. A detector circuit having a plurality of channels receives signals delivered by the force sensitive material of each data-detector probe enabling the monitoring of planarization of the data-detector probe tips as well as controlling the overtravel of the probe tip into the surface having integrated circuits defined thereon. A method of using the multiprobe test system having a probe card with a plurality of data-detector probes located thereon is also disclosed.

7 Claims, 8 Drawing Figures

MULTIPROBE TEST SYSTEM AND METHOD OF USING SAME

BACKGROUND OF THE INVENTION

This invention relates to a multiprobe test system and more specifically to a multiprobe test system utilizing a z-axis detector assembly having a plurality of data-detector probes for sensing surface contact in the z-axis, detecting surface edges, enabling the monitoring of planarization, and controlling overtravel into the surface of a semiconductor slice.

In the formation of electronic circuits, integrated circuits may be fabricated from thin semiconductor slices having a multiplicity of matrices or microcircuits thereon. The general practice is for each slice to contain a multiple of identical repeating matrices of the same type of microcircuits. The individual unit or circuit is sometimes referred to as an integrated circuit chip or an individual bar.

Before distribution the present practice is to test each of the circuits of each integrated chip on a slice or wafer prior to separating the slice into the desired integrated circuit components or combinations thereof.

Since each microcircuit or integrated circuit of each wafer is normally positioned in a predetermined precise relation with respect to adjacent circuit units, it is possible to test the circuitry if the probe can be accurately located on each preselected point that corresponds to the circuit to be tested. It is possible, for example, to test several different circuits at the same time on any one integrated circuit.

In the test procedure, there are several obstacles to overcome in order to have reliable testing without damaging the slice. One of the difficulties experienced in the use of testing probes which include a supporting body having a needle connected thereto, is that the point of the probe tip may form a scratch on the surface of the semiconductor wafer as it is contacted by the point. This is caused by the lack of an effective z-axis control. The z-axis is the direction established by the vertical movement of the chuck or moveable support of the semiconductor slice with respect to the probe tips. Among other things, the z-axis control is needed to compensate for surface warpage of slices which may be as much as 5 mils across the surface of a large slice, determining the point of contact with the wafer, and in determining when the probe tips are off the slice i.e. edge detection.

Semiconductor slice testing is performed on a multiprobe system such as the multiprobe manufactured by Electroglas Corp., Menlo Park, California, model 1034X. The multiprobe machine contains a probe card which is a printed circuit board having attached thereto a series of data probes for injecting signals and collecting test data from the semiconductor slice. The present practice includes an edge sensor on the probe card which is similar to a data probe but having an electrical switch mechanism. Operationally, the conventional edge sensor functions such that when the probe tip makes contact with the silicon slice, an electrical open is caused. This open is detected by the multiprobe system and allows for a continuance of the testing procedures. When the chuck or support block for the semiconductor slice is vertically moved to make contact with the probe tips and no contact is detected by the edge sensor, the open condition will not occur and the multiprobe system will perform an indexing procedure and move the slice such that the data probes are over the next row of integrated circuit chips. This conventional edge sensor has been found to be unreliable in the art and the cause of a significant amount of down time of the multiprobe system and damage to chips which results when the chuck is continuously moved upward and probe tip contact is not identified. After the probe tips make contact with the slice, it is necessary for the chuck to move an additional 1-5 mils of overtravel in order to break through the oxide layer and make good electrical contact with the active circuit elements, a technique called scrub-in. If the probe contact with the slice is not identified, the overtravel cannot be controlled and the result is probe tip breakage because of excessive overtravel, which damages chips and causes machine downtime.

One device for overcoming this basic problem of z-axis control may be found in co-pending U.S. application "Method and Apparatus for Determining Probe Contact", Lee Reid, Ser. No. 873,564 filed Jan. 30, 1978 and assigned to the assignee of the present invention. In the latter co-pending application, a device is disclosed for edge-sensing and z-axis control. This device is in the form of a probe having a force sensitive material attached thereto such that when surface contact is made with the probe tip, the force distributed over the force sensitive material generates a signal that is detected by an external detector circuit and delivered to a multiprobe system. This device is used to sense the edge of a semiconductor slice having a plurality of integrated circuits thereon.

A further problem found in multiprobe test systems is the fact that the nature of the semiconductor slice is such that the integrated circuits defined thereon are in a patterned series of chips which may be rectangular in geometry. Due to the circular nature of the semiconductor slice, there results a series of partial integrated circuit chips on the edges of the semiconductor slice. The use of a single edge sensor will identify approximately half of the partial bars as a surface to be tested and the result is that the multiprobe system will attempt to test these partial bars, wasting time, identifying the partial bars to be a bad circuit, and thereby inking the partial bar for identification. The same problem is encountered in testing a broken semiconductor slice which gives rise to an even increased number of partial bars making edge detection of even greater importance.

Co-pending U.S. application "Four-Quadrant, Multiprobe Edge Sensor for Semiconductor Wafer Probing", Reid et al, Ser. No. 879,038 filed Feb. 21, 1978 and assigned to the assignee of the present invention presents a technique and apparatus for solving the partial bar testing problem. In the latter co-pending application Ser. No. 879,038 filed Feb. 21, 1978 the single data-detector device is replaced with a four-quadrant data-detector device assembly. The four-quadrant edge sensing assembly includes a printed circuit board having a plurality of data probes physically and electrically connected thereto and further having four data-detector probes designed in a manner similar to that found in co-pending application Ser. No. 873,564 filed Jan. 30, 1978. By locating the four data-detector probes on the printed circuit board such that when testing a semiconductor slice the four data-detector probes are found in each corner of an integrated circuit chip, partial integrated circuit chips may be detected as well as the edge of the slice. The signals generated by the force sensitive material found in each of the four data-detector probes are detected by a detector circuit having four channels which in turn delivers the signals to a multiprobe system which enables the identification of partial bars and indexing of the support block, to test the next row of integrated circuit chips.

Although the four-quadrant data-detector approach solves the partial bar and broken chip problem, there still exists a problem in the multiprobe test scheme with respect to monitoring the planarization of the data probes, identification of broken data probes or malfunctioning data probes, and control of the overtravel of the probe tip of the data probe into the surface of the semiconductor slice.

SUMMARY OF THE INVENTION

In accordance with the present invention, it is proposed to locate a plurality of data-detector probes on an electrical support as, for example, a printed circuit board. The data-detector probes are physically and electrically connected to the printed circuit board with each of the plurality of data-detector probes comprising a support body, an arm connected to the support body and extending therefrom in an angular fashion, and a probe tip connected to the arm. The probe tip is connected to the arm with an adjusting mechanism, such as a screw, for changing the plane of the probe tip. The data-detector probe performs as a data probe and as a z-axis detector when a force sensitive material such as lead zirconate-lead titanate (PZT), for example, is bonded to the arm and mechanically deformed when the probe tip makes contact with a surface such as semiconductor slice. By designing the z-axis sensing assembly to have a plurality of data-detector probes rather than simply a plurality of data probes and several edge sensing probes, it is possible to monitor the z-axis contact of each and every data-detector probe upon contact with the semiconductor slice. The signals generated by the force sensitive material on each of the data-detector probes are delivered to a detector circuit which in turn will deliver relevant information to a multiprobe device and/or a minicomputer for evaluation of the timing of the data-detector probe contact with the semiconductor slice to provide effective monitoring of the z-axis movement which will result in effective monitoring of planarization, control of overtravel, probe tip contact identification, and edge sensing.

In a method for testing integrated circuits utilizing a z-axis detector assembly unit having a plurality of data-detector probes placed on an electrical support means in spaced parallel relation to a semiconductor slice, the data-detector probe tips must first be initialized by assuring that the probe tips all lie in the same plane (i.e. planarizing). After initialization, the moveable support means supporting the semiconductor slice must be raised in order to make contact with the plurality of data-detector probes. A minicomputer may be utilized to count the data-detector probes as they make contact with the semiconductor slice based upon the information received from a detector circuit receiving signals from the force sensitive materials of each of the data-detector probes. Planarization may be monitored based on this information by starting a clock upon first contact of the semiconductor slice by one of the plurality of data-detector probes and stopping the clock upon receiving a signal that all of the plurality of data-detector probes have made contact with the semiconductor slice. Planarization may then be determined by calculating the distance between the first data-detector probe to make contact with the semiconductor slice and the last data-detector probe to make contact with the semiconductor slice, considering the number of clock cycles elapsed between the first contact and last contact and the speed of the semiconductor slice approaching the plurality of data-detector probes. Subsequent to monitoring planarization of the data-detector probe tips, overtravel into the semiconductor slice may be controlled by initializing the moveable support of the semiconductor slice to travel a predetermined distance in the z-axis to enable the data-detector probe tips to scrub-in a fixed distance into the semiconductor slice only after the planarization of the data-detector probe tips has been checked and found to fall within a predetermined set limit of planarization. Testing of the integrated circuit chips found on the semiconductor slice may then be performed by delivering test signals by way of the data-detector probes into the integrated circuit chip and evaluating those signals.

DETAILED DESCRIPTION OF THE DRAWINGS

Figure 1:
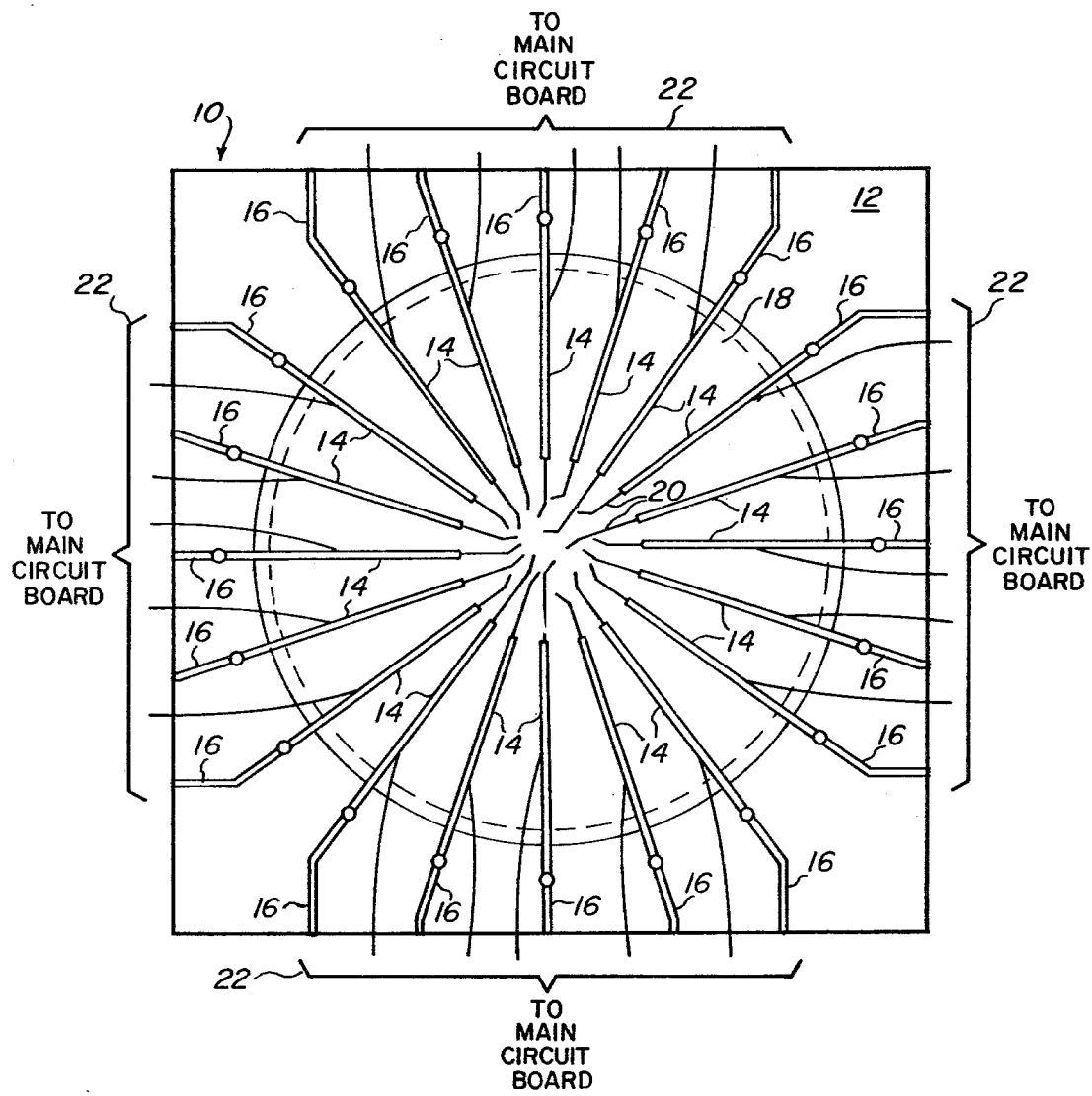
FIG. 1 is a top view of a probe card assembly having a plurality of data-detector probes attached thereto in accordance with the present invention.

Referring now to the drawings, a probe card assembly 10 is illustrated in FIG. 1. The probe card assembly 10 is structured such that a printed circuit board 12 is used to support a plurality of data-detector probes 14 electrically connected to the printed circuit board 12 by leads 16. Leads 16 provide the electrical means for transmitting and receiving signals between the plurality of data-detector probes 14 and a multiprobe device or minicomputer (not shown) for purposes of testing a semiconductor slice. The data-detector probes 14 are shown in FIG. 1 as being located in spaced parallel relation to a semiconductor slice surface 18. Each the plurality of data-detector probes 14 has connected thereto a force sensitive material (not shown) further illustrated in FIG. 2 and described hereinafter, which recognizes contact in the z-axis of the probe tips 20 to the semiconductor slice surface 18. This detection in the z-axis is signalled to a detector circuit, illustrated in FIG. 3 and described hereinafter, by way of lead wires 22.

Figure 2:
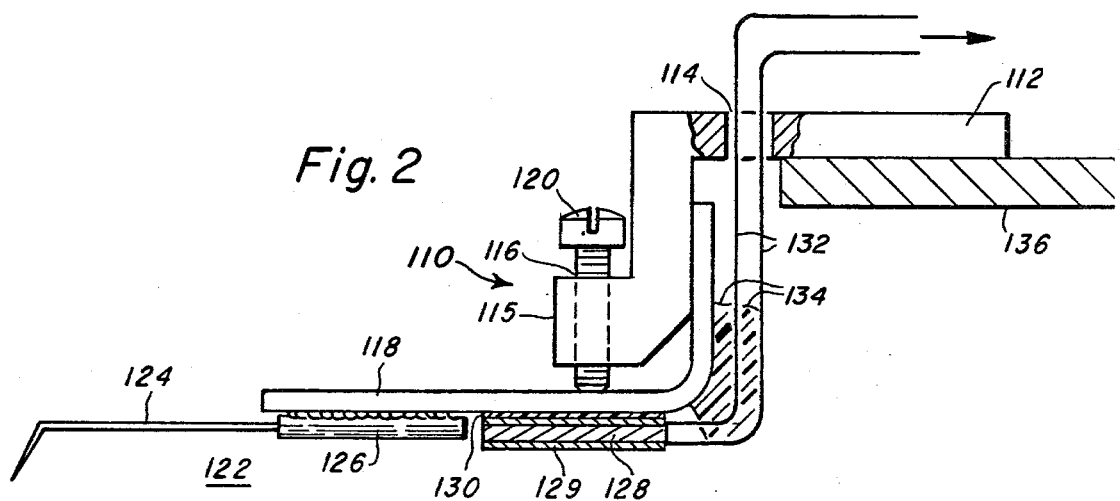
FIG. 2 is a diagrammatic side view of the data-detector probe found in FIG. 1 in accordance with the present invention.

Structurally, the data-detector probe device 110 in FIG. 2 comprises a support body 112 having first and second apertures 114 and 116, respectively. The support body 112 may be an L-shaped structure where the first aperture 114 is located on the long side of the L and the second aperture 116 is located in the flange 115 of the short side of the L-shaped structure 112. The support body 112 may be of a conductive material such as brass, for example, and further may be gold plated.

An arm 118 is attached to the support body 112 and is extended therefrom. The extended arm 118 may also have an L-shaped structure such that the short section of the L-shaped arm is attached to the short section of the L-shaped support structure 112. The extended arm 118 may also be of a conductive material such as brass and also may be gold plated.

An adjusting screw 120 located within said second aperture 116 found in the support structure 112 extends through to the extended arm 118.

A probe tip assembly 122 having a probe tip 124 and a probe tip support sleeve 126 is attached to the extended arm 118. The probe tip 124 is utilized to contact the semiconductor slice having integrated circuits thereon such that relevant electrical data signifying the usefulness of a particular integrated circuit chip may be obtained. This is the main function of the probe tip 124 when utilized as a data gathering probe.

In order to sense z-axis contact, that is that point in time when the test needle 124 has made contact with a semiconductor surface, a force sensitive material 128 may be attached to the extended arm 118 of the test probe detector device 110. The force sensitive material is bordered by silver plated regions 129. In order to insulate the force sensitive material 128 from the conductive properties of the remainder of the probe device 110, the silver plates 129 of the force sensitive material 128 may be attached to the extended arm 118 by insulating epoxy material 130. The force sensitive material 128 may comprise a piezoelectric substrate or a monomorph or a piezoelectric sandwich type structure called a bimorph. The characteristics of the piezoelectric material are such that it may perform as a generator. This characteristic is such that when the piezoelectric material is deformed or flexed, a voltage signal is generated by the material itself. A pair of lead wires or conductors 132 are soldered to the silver plates 129 of the force sensitive material 128. Thus, if a piezoelectric material were used as a force sensitive material 128, upon deforming a voltage will be generated and sensed across lead wires 132. Lead wires 132 are insulated from each other. Each lead wire is covered with a conforming insulation and extended up through the first aperture 114 found in the support body 112 of the probe detector test structure 110. The signal is then delivered to a detector circuit illustrated in FIG. 3 described hereinafter. The lead wires 132 may be bonded to the arm 118 by an epoxy 134.

Figure 3:
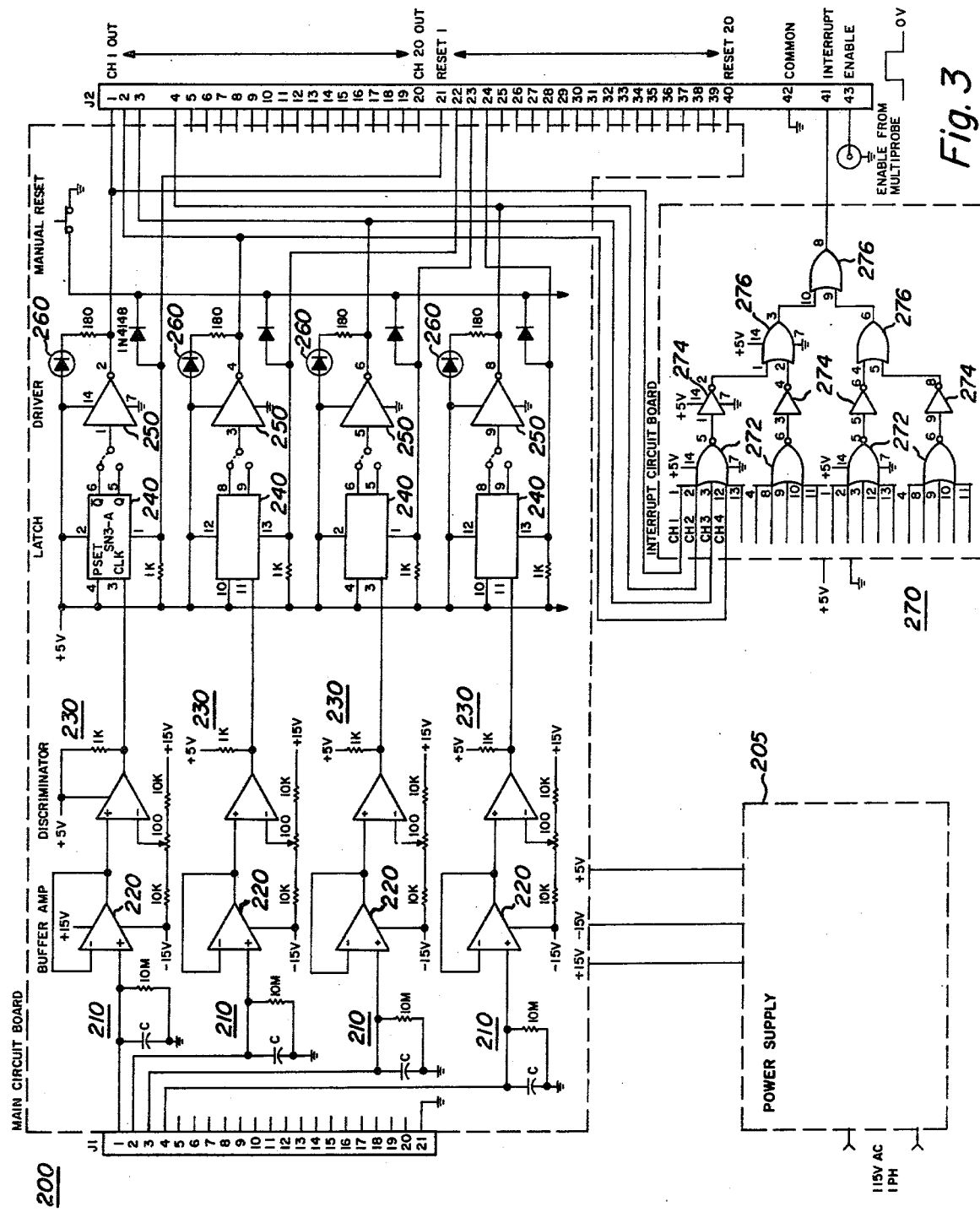
FIG. 3 is a partial block diagram and partial circuit schematic illustrating a detector circuit to be used in a multi-probe test system in accordance with the present invention.
Figure 5A:
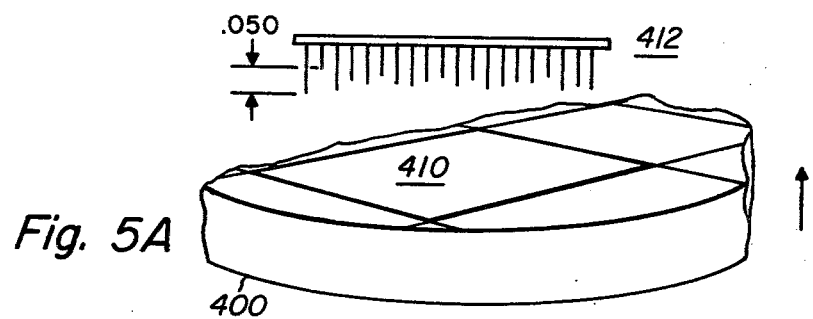
FIGS. 5A–5D are diagrammatic perspective views of the probe card assembly and a moveable support block supporting a semiconductor slice in accordance with the present invention.
Figure 5B:
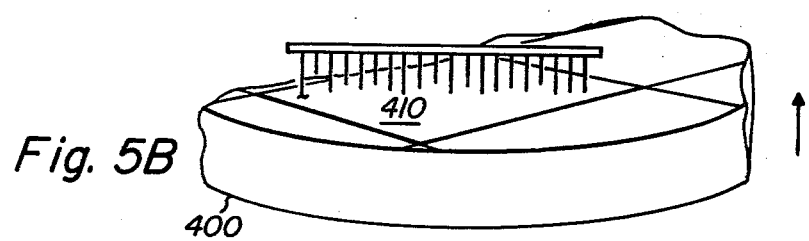
Figure 5C:
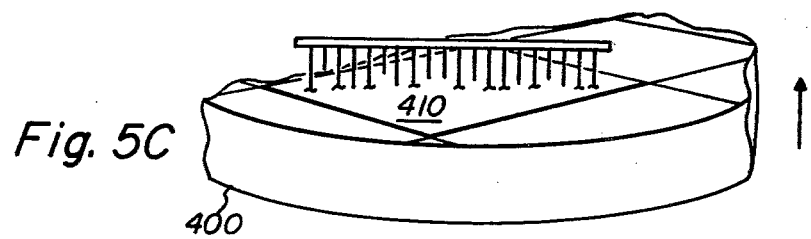
Figure 5D:
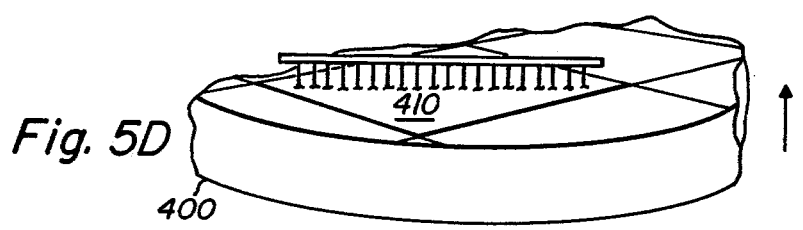

Referring now to FIGS. 1 and 3, a probe card assembly 10 (FIG. 1) described above and a detector circuit 200 are illustrated. Each data-detector probe 14 has a dual function of providing a signal for z-axis contact and delivering test signals to and from the integrated circuit chips. Lead wires 22 extending from the data-detector probes 14 electrically connect the z-axis detector 10 to a detector circuit 200. The detector circuit board 200 demonstrates four independent detector channels to be used by one of the plurality of data-detector probes 14. A power supply 205 is utilized to provide a ±15 volt and +5 volt power source to the detector circuit 200. Each channel comprises an RC filter assembly 210 electrically connected to a unity gain buffer amplifier 220 where the RC filter 210 filters noise spikes and dampens response time of the voltage signal received from the data-detector probes 14. The unity gain buffer amplifier 220 transforms the voltage signal from a high impedance signal to a low impedance signal. The unity gain buffer amplifier may be of the type made and manufactured by Texas Instruments Incorporated, Dallas, Texas model TL084N. This low impedance signal is then delivered to a level discriminator assembly 230. The level discriminator assembly 230 is of the threshold level type whereby unless the signal reaches a predetermined threshold voltage, for example, 30 millivolts, the low impedance signal will not be recognized and essentially blocked. If, however, the low impedance signal is above the threshold limit, the discriminator output will be set to the maximum voltage, as, for example, the 5 volts found in the FIG. 3 circuit. The level discriminator may be the type made and manufactured by Texas Instruments Incorporated, Dallas, Texas model LM339N. After discriminating against low level noise signals, the desired signal at a nominal 5 volts voltage level is delivered to a latch circuit 240 which latches the signal to, for example, a 0 voltage and delivers that signal to a buffer/driver 250. The buffer/driver 250 provides the necessary power to enable the light emitting diode 260 as well as provide signals to the computer and the interrupt circuit board 270. The latching circuit may be of the type made and manufactured by Texas Instruments Incorporated, Dallas, Texas, model 7474N, while the buffer/driver may be of the type made and manufactured by Texas Instruments Incorporated, Dallas, Texas, model 7404N. The latch signals is delivered to an interrupt circuit 270 and may be grouped in units of 4, for example, and delivered to a series of "NOR" gates 272 followed by an inversion of the signal by inverters 274, and finally channeled to a series of "OR" gates 276. The NOR gates 272, inverter-buffer driver 274 and the 'OR' gates 276 may also be of the type made and manufactured by Texas Instruments Incorporated, Dallas, Texas, models 74S260N, 7404N, and 7432N, respectively. If all of the data-detector probes 14 contact the semiconductor surface 18, an output interrupt signal will be delivered to a multiprobe unit or minicomputer (not shown). If, however, any one of the inputs to the "NOR" gates fails to go "high", for example, that will indicate that one or more of the data-detector probes 14 has not made contact with the semiconductor slice 18 and a data-detector probe failure or edge condition is present. This interrupt state can cause the multiprobe to index and begin testing a new row of integrated circuit chips. When an interrupt condition occurs, the minicomputer will send a reset signal back to the latch circuit 240 to reset the latch to its predetermined state in preparation for the next chip to be tested.

Figure 4:
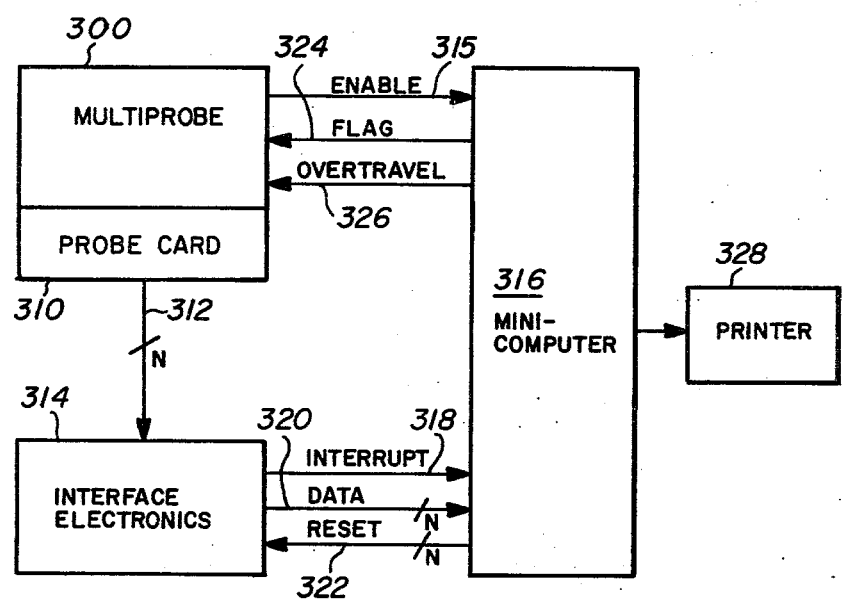
FIG. 4 is a block diagram illustrating a multiprobe test system using the probe card assembly of FIG. 1, the data-detector probe illustrated in FIG. 2, and the detector circuit illustrated in FIG. 3.

Referring now to FIG. 4 in conjunction with FIGS. 1 and 3, where a multiprobe test system is illustrated. A multiprobe such as the multiprobe system made and manufactured by Electroglas Corp., Menlo Park, California, model 1034X is utilized with a probe assembly 10 such as the probe assembly illustrated in FIG. 1 of the drawings to provide signal information by way of a plurality of data lines 312 to interface electronics 314 which may be in the form of the 4 channel detector circuit 200 illustrated in FIG. 3 and described above. The multiprobe 300 and the interface electronics 314 are electrically connected to a minicomputer 316 such as the minicomputer made and manufactured by Texas Instruments Incorporated, Dallas, Texas, model TI/960. The multiprobe device will deliver an enable signal 315 to the minicomputer 316 to initiate test procedures for a semiconductor slice 18 and the interface electronics 314 will deliver a interrupt signal 318 and data 320 to the minicomputer 316 for evaluation of the z-axis contact made by the data-detector probes 14 with a semiconductor 18. The minicomputer 316 will then deliver a reset signal 322 to the channels of the interface electronics 314 resetting the latch circuit 240 as was described with respect to FIG. 3.

Referring now more specifically to FIGS. 4 and 5A–5D the movement of a programmable moveable support 400 supporting a semiconductor slice 410 progressing in the z-axis toward a plurality of data-detector probe tips 412 is shown in FIGS. 5A–5D.

In a method for utilizing the multiprobe system illustrated in FIG. 4, the data-detector tips 412 are first initialized by adjusting the data-detector probe tips to be in the same plane within 0.5 mils, for example. The multiprobe device 300 utilizes a programmable moveable support 400 which supports a semiconductor slice 410 having a plurality of integrated circuit chips thereon. The moveable support 400 progresses in the z-axis toward the plurality of data-detector probe tips 412 whereupon the first data-detector probe tip makes contact with the surface 410 such that the interface electronics 314, which as stated above may be in the form of detector circuit as illustrated in FIG. 3, receives a voltage signal from the force sensitive material on the data-detector probe making contact with the surface 410. This signal is transmitted to the minicomputer 316 over the data line 320 informing the minicomputer 316 that one or more data-detector probe tip contacts has been made and to start a clock running at the time of contact. Based upon a predetermined number of data-detector probes present in the system and said number stored in the computer, the minicomputer 316 will monitor the number of data-detector probes making contact with the surface 410 until all data-detector probes have made contact. However, if there is a data-detector probe failure or an edge condition exists, the predetermined number of data-detector probes will not be reached. A predetermined clock cycle limit which represents distance is stored in the minicomputer to prevent probe tip breakage from excess overtravel. If this number is exceeded, the minicomputer 316 will then generate a flag signalling the multiprobe 300 to stop the moveable support. This signal is sent by way of data line 324. If the number of data-detector probes making contact agrees with the predetermined number of probes placed in the minicomputer system 316, upon receiving a signal that the last data-detector probe has made contact, the clock will stop and based upon the speed of the moveable support and the number of clock cycles between the first data-detector probe making contact with the semiconductor slice 410 and the last data-detector probe making contact with the semiconductor slice 410, a calculation is made to determine if the distance between the first and last data-detector probes making contact is within an acceptable tolerance when compared to a planarization limit of approximately 0.5 mils. Thus, monitoring planarization is accomplished to assure that no one data-detector probe will scrub into the semiconductor surface 410 such that the probe tip, or bar, will be damaged causing machine downtime and loss of product. Also, upon receiving a signal that the last data-detector probe tip has made contact with the semiconductor slice 410, the minicomputer will send a signal by way of data line 326 to the multiprobe instructing the multiprobe device 300 to move the moveable support a fixed distance for overtravel of the data-detector probe tips into the semiconductor surface 410, i.e. scrubbing in the tip through the oxide layer of the semiconductor slice 410 to make good electrical contact. This overtravel distance is adjustable and may be on the order of 2–5 mils. Thus, the recognition of the time elapsed between the first data-detector probe making contact with the semiconductor slice 410 and the last data-detector probe making contact with the semiconductor slice enables the monitoring of the planarization of the data-detector probe tips and further enables the control of the overtravel of the data-detector probe tips into the semiconductor surface 410. After completing the current test and prior to starting the next test, the minicomputer 316 delivers a reset signal to the interface electronics 314 to reset the latch circuit to prepare for the next test of integrated circuits. Further, test signals are delivered to the semiconductor slice integrated circuits by way of the data-detector probes for determining if the integrated circuit chips are operable. All information concerning data-detector probe failure, or edge condition or test status is finally delivered to a terminal printer 328 for user interface. The terminal printer may be of the type manufactured by Texas Instruments Incorporated, Dallas, Texas, model 700.

While the present invention has been described and illustrated with specific embodiments, it should be apparent to those skilled in the art that various modifications may be made without departing from the spirit and scope of the present invention.

What is claimed is:

1. A multiprobe test system for testing microcircuits comprising:

moveable support means for locating a semiconductor slice having a plurality of integrated circuits thereon;

electrical support means located in parallel spaced relation to said moveable support means;

a plurality of data-detector probes electrically connected to said electrical support means for detecting the surface of said semiconductor slice, each of said data-detector probes including:
  a support body,
  an arm connected to said support body and extending therefrom in an angular fashion,
  a probe tip having an angular point connected to said arm and extending therefrom, and
  sensing means comprising a force sensitive material bonded to said arm for sensing when said probe tip makes contact with said semiconductor slice and generating a signal indicative thereof;

detector circuit means electrically associated with and connected to said data-detector probes for delivering electrical signals signifying that said data-detector probes have made contact with said semiconductor slice, said detector circuit means comprising a multichannel circuit wherein each channel includes:
  filtering means for reducing noise from a signal delivered from said force sensitive material,
  amplifier circuitry electrically connected to said filter means for transforming the impedance of said signal,
  electronic discriminator means for screening spurious signals such that only signals above a fixed threshold voltage will be detected, said discriminator means being electrically connected to said amplifier circuitry,
  latch circuit means for latching said signal, and buffer driver means for boosting the power of said signal and delivering an output signal;

means for evaluating output signals received from said detector circuit means as delivered by said buffer driver means thereof; and system output means electrically connected to said means for evaluating and operatively associated therewith for displaying said detector circuit means signals.

2. A multiprobe test system for testing microcircuits as set forth in claim 1, wherein each of said data-detector probes further includes adjustable means attached to said support body and operatively associated with said arm for altering the plane in which said probe tip lies.

3. A multiprobe test system for testing microcircuits as set forth in claim 2, further including a light emitting diode element in each of said channels electrically connected to said buffer driver means for displaying respective signals of said data-detector probes signifying that the corresponding one of said data-detector probes has made contact with the surface of said semiconductor slice.

4. A multiprobe test system for testing microcircuits as set forth in claim 3, further including interrupt circuit means for summing said output signals of said detector circuit means and delivering an interrupt signal to said means for evaluating said output signals.

5. A multiprobe test system for testing microcircuits as set forth in claim 4, wherein said interrupt circuit means comprises a series of NOR gates for receiving the output signals of said buffer driver means, a plurality of inverters respectively connected to the outputs of said NOR gates, and a series of OR gates having first and second inputs and disposed in a summing arrangement, at least a plurality of said OR gates with one OR gate being connected to the outputs of a respective pair of said inverters, and including a final OR gate connected to the outputs of a pair of OR gates included in said series, said final OR gate providing a summed output signal for delivery to said means for evaluating said output signals for determining if all data-detector probes have made contact with the surface of said semiconductor slice.

6. A method for testing integrated circuits disposed on a semiconductor slice using a plurality of data-detector probes located on an electrical support placed over said semiconductor slice in spaced parallel relation, and computational evaluation means, comprising the steps of:

planarizing said data-detector probes on said electrical support such that all data-detector probes lie in the same plane;

raising said semiconductor slice in the z-axis to make contact with said plurality of data-detector probes;

counting data-detector probes as they make contact with the surface of said semiconductor slice;

monitoring planarization of said data-detector probes throughout testing by:

starting a clock upon first contact of the surface of said semiconductor slice with one of said plurality of data-detector probes, stopping said clock upon receiving a signal that all of said plurality of data-detector probes have made contact with the surface of said semiconductor slice, calculating the distance between the first of said plurality of data-detector probes making contact with said semiconductor slice and the last of said plurality of data-detector probes making contact with said semiconductor slice considering the number of clock cycles and the speed of the semiconductor slice approaching said plurality of data-detector probes, and comparing the calculated distance between said first and said last of said data-detector probes making contact with said semiconductor slice with a predetermined planarization limit;

controlling overtravel of said data-detector probes into said semiconductor slice; and delivering test signals between said computational evaluation means and said integrated circuits disposed on said semiconductor slice.

7. A method for testing integrated circuits disposed on a semiconductor slice as set forth in claim 6, wherein the step of controlling overtravel includes:

raising said semiconductor slice at a predetermined rate for a fixed number of clock cycles after the last data-detector probe makes contact with the surface of said semiconductor slice, thereby scrubbing the data-detector probes into the surface of said semiconductor slice for enhancing electrical contact to the said integrated circuits.

* * * * *